(12) United States Patent
Duan

(10) Patent No.: US 10,833,627 B2
(45) Date of Patent: Nov. 10, 2020

(54) ELECTRICALLY CONDUCTIVE MODULE OF SOLAR CELL TERMINAL BOX

(71) Applicant: ZHEJIANG RENHE PHOTOVOLTAIC TECHNOLOGY CO., LTD., Zhejiang Province (CN)

(72) Inventor: Lijun Duan, Zhejiang Province (CN)

(73) Assignee: ZHEJIANG RENHE PHOTOVOLTAIC TECHNOLOGY CO., LTD., Cixi (CN)

( * ) Notice: Subject to any disclaimer, the term of this patent is extended or adjusted under 35 U.S.C. 154(b) by 75 days.

(21) Appl. No.: 16/251,812

(22) Filed: Jan. 18, 2019

(65) Prior Publication Data

US 2019/0222171 A1   Jul. 18, 2019

(30) Foreign Application Priority Data

Jan. 18, 2018  (CN) .......................... 2018 1 0048360

(51) Int. Cl.
*H02S 40/34* (2014.01)
*H01L 31/02* (2006.01)
*H02G 3/08* (2006.01)

(52) U.S. Cl.
CPC ........ *H02S 40/34* (2014.12); *H01L 31/02013* (2013.01); *H01L 31/02021* (2013.01); *H02G 3/081* (2013.01)

(58) Field of Classification Search
CPC combination set(s) only.
See application file for complete search history.

(56) References Cited

U.S. PATENT DOCUMENTS 3,882,428 A * 5/1975 Leenders .................. H01P 1/37
                                                                        333/24.2
4,121,182 A * 10/1978 Makimoto .............. H01P 1/203
                                                                        331/177 V (Continued)

*Primary Examiner* — Binh B Tran
*Assistant Examiner* — Krystal Robinson
(74) *Attorney, Agent, or Firm* — Jiwen Chen; Jacobson Holman PLLC

(57) ABSTRACT

The present invention discloses an electrically conductive module of a solar cell terminal box. The electrically conductive module comprises an insulation body, conducting strips and a diode chip, wherein there are two and only two conducting strips. The two conducting strips are electrically connected through the diode chip. The diode chip is located inside the insulation body. Each of the two conducting strips is provided with a through hole. The two side edges, which are fixed with the conducting strips, of the insulation body overlap with the through holes. A connection region between the insulation body and each of the conducting strips is only a region between the end portion of the corresponding through hole and the edge of the conducting strip. A part of each through hole is located inside the insulation body, and the remaining part of the through hole is located outside the insulation body and forms an enclosed busbar welding hole together with two side edges of the insulation body. The connection regions between the insulation body and the conducting strips are just the four smaller regions between the end portions of the through holes and the edges of the conducting strips, which can effectively prevent the insulation body from suffering the acting force exerted by the external force through the conducting strips, and avoid the phenomenon that the body is damaged or excessively stressed, etc.

2 Claims, 1 Drawing Sheet

(56) References Cited

U.S. PATENT DOCUMENTS

| | | | | |
|---|---|---|---|---|
| 4,857,483 A * | 8/1989 | Steffen | B29C 45/14655 | 264/272.17 |
| 5,341,114 A * | 8/1994 | Calviello | H01L 27/0605 | 257/E27.012 |
| 5,610,685 A * | 3/1997 | Aiba | B41J 2/45 | 257/E27.121 |
| 6,483,623 B1 * | 11/2002 | Maruyama | H01L 33/60 | 257/676 |
| 7,436,002 B2 * | 10/2008 | Brunner | H05K 3/3426 | 257/99 |
| 8,035,125 B2 * | 10/2011 | Abe | H01L 33/54 | 257/99 |
| 8,137,115 B1 * | 3/2012 | Chou | H02S 40/34 | 439/76.1 |
| 8,563,849 B2 * | 10/2013 | Johnston | H01L 31/052 | 136/246 |
| 8,598,688 B2 * | 12/2013 | Fukuda | H01L 29/0661 | 257/622 |
| 8,669,572 B2 * | 3/2014 | Leung | H01L 33/486 | 257/98 |
| 8,854,825 B2 * | 10/2014 | Yamazaki | H02S 40/34 | 361/730 |
| 9,035,439 B2 * | 5/2015 | Xuan | H05K 5/0091 | 257/676 |
| 2002/0066905 A1 * | 6/2002 | Wang | H01L 33/486 | 257/91 |
| 2002/0130405 A1 * | 9/2002 | Kobayashi | H01L 23/49562 | 257/687 |
| 2002/0195935 A1 * | 12/2002 | Jager | H01L 33/486 | 313/512 |
| 2003/0193322 A1 * | 10/2003 | Higashikozono | H02S 40/34 | 323/299 |
| 2004/0036081 A1 * | 2/2004 | Okazaki | H01L 33/54 | 257/99 |
| 2004/0047151 A1 * | 3/2004 | Bogner | H01L 25/167 | 362/236 |
| 2004/0075100 A1 * | 4/2004 | Bogner | H01L 33/642 | 257/99 |
| 2005/0224110 A1 * | 10/2005 | Yoshikawa | H02S 40/345 | 136/251 |
| 2006/0060867 A1 * | 3/2006 | Suehiro | H01L 33/56 | 257/81 |
| 2007/0262328 A1 * | 11/2007 | Bando | H01L 33/62 | 257/79 |
| 2008/0011348 A1 * | 1/2008 | Aoyama | H02S 40/345 | 136/244 |
| 2008/0079019 A1 * | 4/2008 | Huang | H01L 33/647 | 257/99 |
| 2009/0154166 A1 * | 6/2009 | Zhang | F21K 9/20 | 362/294 |
| 2009/0260676 A1 * | 10/2009 | McMahon | H02S 40/34 | 136/251 |
| 2009/0290273 A1 * | 11/2009 | Shih | H01L 25/167 | 361/56 |
| 2010/0263714 A1 * | 10/2010 | Lauermann | H02S 40/34 | 136/251 |
| 2011/0183531 A1 * | 7/2011 | Hornung | H02S 40/34 | 439/76.1 |
| 2016/0111240 A1 * | 4/2016 | Beckert | H01H 69/02 | 337/187 |
| 2016/0380171 A1 * | 12/2016 | Lin | H01L 33/642 | 257/98 |
| 2019/0003659 A1 * | 1/2019 | Miyajima | F21K 9/27 | |

* cited by examiner

ELECTRICALLY CONDUCTIVE MODULE OF SOLAR CELL TERMINAL BOX

This application claims the priority benefit of Chinese Application No. 201810048360.7, filed Jan. 18, 2018, which is hereby incorporated by reference.

TECHNICAL FIELD

The present invention belongs to the technical field of solar cells, in particular to an electrically conductive module of a solar cell terminal box.

BACKGROUND OF THE TECHNOLOGY

The solar cell, also known as a "solar chip" or "photocell," is a photoelectric semiconductor wafer that uses solar light to generate electricity directly. As long as the solar cell is illuminated by a certain illumination condition, it can output a voltage instantaneously and generate current in the presence of a loop. The terminal box is very important in the composition of a solar module, and mainly functions to connect the power generated by the solar cell to an external circuit. The traditional terminal box has a diode, conducting strips and soldering tin, wherein diode components are produced independently; the conducting strips are produced independently; a chip of the diode is soldered on positive and negative pins of the diode, and then encapsulated with potting glue to form the diode; the pins of the diode are then soldered to the conducting strips. In the production process, diode soldering requires significant manpower, material resources and production resources. At the same time, the diode chip and the conducting strips are subjected to secondary soldering, which reduces the heat conduction performance, such that the terminal box is easily damaged by heat generation.

SUMMARY OF THE INVENTION

An object of the present invention is to provide an electrically conductive module of a solar cell terminal box, which is stable in structure, easy to mount and use and is replaceable.

In this regard, the technical solution of the present invention is as follows: an electrically conductive module of a solar cell terminal box comprises an insulation body, conducting strips and a diode chip, wherein there are two and only two conducting strips. The two conducting strips are electrically connected through the diode chip. The diode chip is located inside the insulation body. The electrically conductive module is characterized in that: each of the two conducting strips is provided with a through hole which is of a strip-shaped structure, and two ends of each through hole are close to the edge of the corresponding conducting strip; the two side edges, which are fixed with the conducting strips, of the insulation body overlap with the through holes; a connection region between the insulation body and each of the conducting strips is only a region between the end part of the corresponding through hole and the edge of the conducting strip; a part of each through hole is located inside the insulation body, and the remaining part of the through hole is located outside the insulation body, and form an enclosed busbar soldering hole together with two side edges of the insulation body.

Preferably, the insulation body wraps around the outside of a part of the conducting strips between the diode chip and the two through holes; with the conducting strips as a boundary, the insulation body is divided into an upper part and a lower part, wherein the diode chip is located on the upper part of the insulation body, and a radial section on the lower part of the insulation body is in an inverted trapezoidal shape; two side edges, close to the busbar soldering hole, of the insulation body are inclined surfaces.

Preferably, the diode chip is located on one of the conducting strips and connected to the other conducting strip via a jumper wire, and the diode chip is located in the center of the two conducting strips.

According to the electrically conductive module disclosed by the present invention, the insulation body just wraps around the through hole positions on the conducting strips, wherein a part of each through hole is located inside the body, and the other part of the through hole is located outside the body, such that the connection region between the insulation body and the conducting strips are the four smaller regions between the end parts of the through holes and the edges of the conducting strips, which can effectively prevent the insulation body from suffering the acting force exerted by the external force through the conducting strips, and avoid the phenomenon that the body is damaged or excessively stressed, etc. However, the edge of the insulation body and a half-edge hole exposed from the conducting strips form the enclosed busbar soldering hole. An inclined angle is arranged at the lower half edge of the insulation body, which facilitates correcting a busbar. A busbar soldering region of an assembly is arranged in the middle of the product, such that the busbar is welded more easily. However, the diode chip is located in the approximately central position of the entire product, such that heat can be transferred around effectively.

BRIEF DESCRIPTION OF THE DRAWINGS

A detailed description will be made below in conjunction with the drawings and embodiments of the present invention.

Figure 1:
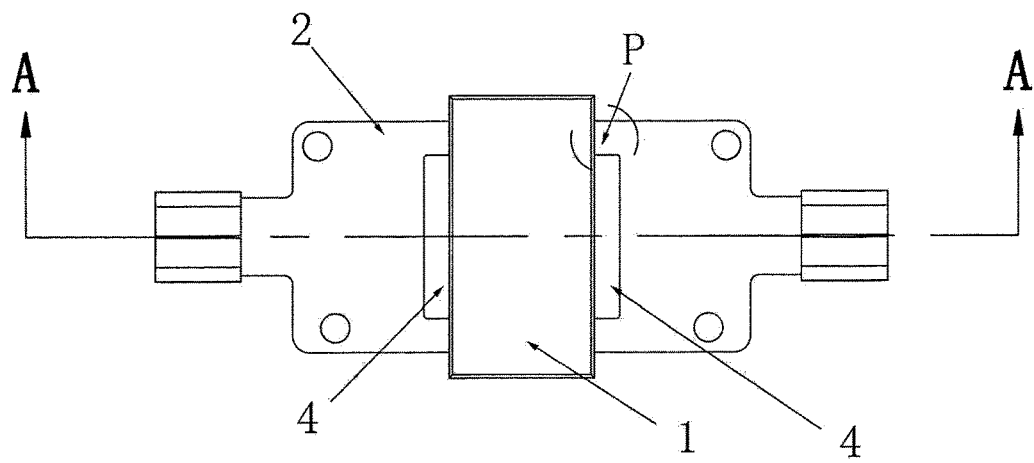
FIG. 1 is a schematic structural diagram of the present invention.
Figure 2:
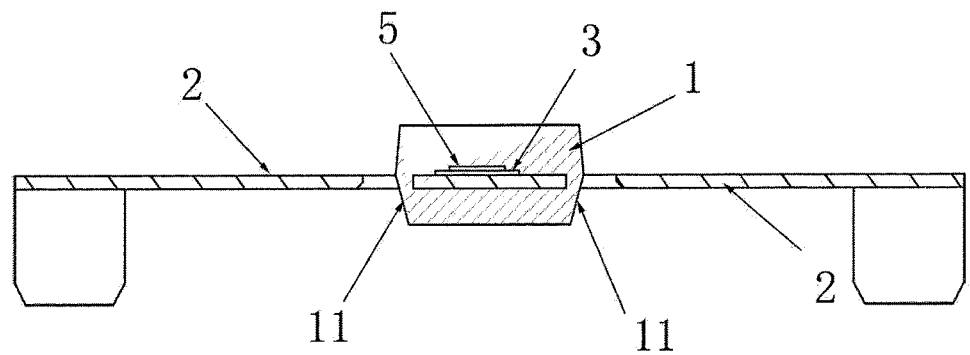
FIG. 2 is an A-A sectional view of FIG. 1.
Figure 3:
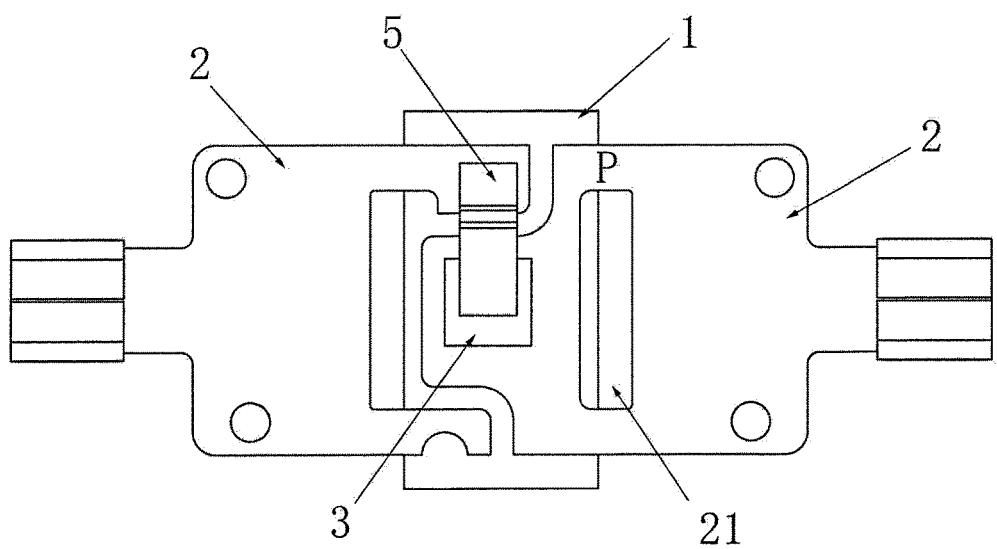
FIG. 3 is an internal schematic structural diagram of the present invention.

In drawings, the reference symbols represent the following components: 1—insulation body; 11—inclined surface; 2—conducting strip; 21—through hole; 3—diode chip; 4—busbar soldering hole; 5—jumper wire.

DETAILED DESCRIPTION OF THE EMBODIMENTS

Referring to drawings, an electrically conductive module of a solar cell terminal box in the present embodiment comprises an insulation body 1, conducting strips 2 and a diode chip 3, wherein there are two and only two conducting strips 2. The two conducting strips 2 are electrically connected through the diode chip 3. The diode chip 3 is located inside the insulation body 1. Each of the two conducting strips is provided with a through hole 21 which is of a strip-shaped structure, and two ends of each through hole 21 are close to the edge of the corresponding conducting strip; the two side edges, which are fixed with the conducting strips 2, of the insulation body 1 overlap with the through holes 21; a connection region between the insulation body 1 and each of the conducting strips 2 is only a smaller region P between the end part of the corresponding through hole and the edge of the conducting strip, which can effectively prevent the insulation body from suffering the acting force exerted by the external force through the conducting strips, and avoid the phenomenon that the body is damaged or excessively stressed, etc. A part of each through hole 21 is located inside the insulation body 1, and the remaining part of the through hole 21 is located outside the insulation body 1 and forms an enclosed busbar soldering hole together with the side edges of the insulation body.

The insulation body 1 wraps around the outside of a part of the conducting strips between the diode chip 3 and the two through holes 21. With the conducting strips as a boundary, the insulation body is divided into an upper part and a lower part, wherein the diode chip 3 is located on the upper part of the insulation body 1, and a radial section on the lower part of the insulation body is in an inverted trapezoidal shape. Two side edges, close to the busbar soldering hole 4, of the insulation body are inclined surfaces 11, which facilitate correcting a busbar. In addition, a busbar soldering region of an assembly is arranged in the middle of the product, such that the busbar is welded more easily.

One of the conducting strips is mounted and connected to the diode chip 3, and the diode chip is connected to the other conducting strip via a jumper wire 5 and is located in the center of the two conducting strips, i.e., the approximately central position of the entire product, such that heat can be transferred around effectively.

The invention claimed is:

1. An electrically conductive module of a solar cell terminal box, comprising an insulation body, two and only two conducting strips and a diode chip, wherein the two conducting strips are electrically connected through the diode chip; the diode chip is located inside the insulation body; the electrically conductive module is characterized in that: each of the two conducting strips is provided with a through hole which is of a strip-shaped structure, and two ends of each through hole are close to the edge of the corresponding conducting strip; the two side edges, which are fixed with the conducting strips, of the insulation body overlap with the through holes; a connection region between the insulation body and each of the conducting strips is only a region between the end part of the corresponding through hole and the edge of the conducting strip; a part of each through hole is located inside the insulation body, and the remaining part of the through hole is located outside the insulation body, and forms an enclosed busbar soldering hole together with two side edges of the insulation body, wherein the insulation body wraps around the outside of a part of the conducting strips between the diode chip and the two through holes; with the conducting strips as a boundary, the insulation body is divided into an upper part and a lower part, wherein the diode chip is located on the upper part of the insulation body, and a radial section on the lower part of the insulation body is in an inverted trapezoidal shape; two side edges, close to the busbar soldering hole, of the insulation body are inclined surfaces.

2. An electrically conductive module of a solar cell terminal box, comprising an insulation body, two and only two conducting strips and a diode chip, wherein the two conducting strips are electrically connected through the diode chip; the diode chip is located inside the insulation body; the electrically conductive module is characterized in that: each of the two conducting strips is provided with a through hole which is of a strip-shaped structure, and two ends of each through hole are close to the edge of the corresponding conducting strip; the two side edges, which are fixed with the conducting strips, of the insulation body overlap with the through holes; a connection region between the insulation body and each of the conducting strips is only a region between the end part of the corresponding through hole and the edge of the conducting strip; a part of each through hole is located inside the insulation body, and the remaining part of the through hole is located outside the insulation body, and forms an enclosed busbar soldering hole together with two side edges of the insulation body, wherein the diode chip is located on one of the conducting strips and connected to the other conducting strip via a jumper wire, and the diode chip is located in the center of the two conducting strips.

* * * * *